(12) United States Patent
Kim et al.

(10) Patent No.: US 11,304,287 B1
(45) Date of Patent: Apr. 12, 2022

(54) EXTREME ULTRAVIOLET LIGHT SOURCE SYSTEMS

(71) Applicant: Samsung Electronics Co., Ltd., Suwon-si (KR)

(72) Inventors: Sunghyup Kim, Hwaseong-si (KR); Myeongjun Gil, Seoul (KR); Yebin Nam, Suwon-si (KR); Sanghoon Lee, Seoul (KR); Injae Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/325,327

(22) Filed: May 20, 2021

(30) Foreign Application Priority Data

Sep. 29, 2020 (KR) .................. 10-2020-0126588

(51) Int. Cl.
*H05G 2/00* (2006.01)
*G03F 7/20* (2006.01)

(52) U.S. Cl.
CPC .......... *H05G 2/008* (2013.01); *G03F 7/70033* (2013.01); *G03F 7/7085* (2013.01); *G03F 7/70166* (2013.01); *G03F 7/70858* (2013.01)

(58) Field of Classification Search
CPC .......... H05G 2/00–008; G03F 7/70025; G03F 7/70033; G03F 7/70041; G03F 7/70166; G03F 7/7085; G03F 7/70858; G03F 7/20; G03F 2/2035; G03F 2/2039; G03F 7/70; G03F 7/70008; G03F 7/70058; G03F 7/7015; G03F 7/708; G03F 7/70808; G03F 7/70841; G03F 7/70866; G03F 7/70875; G03F 7/70883; G03F 7/70891; G03F 7/70908; G03F 7/70916; G03F 7/70925; G03F 7/70933; G03F 7/70941; G03F 7/70958; G03F 7/70975; G03F 7/70991
USPC .................. 355/30, 52–55, 67–71, 77; 250/492.1–492.3, 493.1, 504 R, 505.1, 250/515.1
See application file for complete search history.

(56) References Cited

U.S. PATENT DOCUMENTS

| | | | |
|---|---|---|---|
| 6,809,327 B2 * | 10/2004 | Bristol | G03F 7/70033 250/504 R |
| 8,558,202 B2 | 10/2013 | Yanagida et al. | |
| 9,606,445 B2 | 3/2017 | Banine et al. | |
| 9,609,731 B2 | 3/2017 | Merrill et al. | |
| 2006/0131515 A1 | 6/2006 | Partlo et al. | |
| 2006/0192151 A1 * | 8/2006 | Bowering | B82Y 10/00 250/503.1 |
| 2007/0018119 A1 * | 1/2007 | Yabuta | H05G 2/003 250/493.1 |

(Continued)

*Primary Examiner* — Christina A Riddle
(74) *Attorney, Agent, or Firm* — Myers Bigel, P.A.

(57) ABSTRACT

Extreme ultraviolet light source systems may include a chamber including a condensing mirror and having an intermediate focus, by which extreme ultraviolet light reflected from the condensing mirror is emitted along a first optical path, a blocking plate that may be on the chamber so as to intersect the first optical path and may include an opening through which the extreme ultraviolet light is emitted, a transparent cover on the blocking plate so as to cover the opening, a nozzle that may be between the chamber and the blocking plate so that an end portion faces the intermediate focus and may spray a first gas in a direction intersecting the first optical path, and an exhaust pipe between the chamber and the blocking plate so as to face the end portion of the nozzle.

20 Claims, 6 Drawing Sheets

(56) References Cited

U.S. PATENT DOCUMENTS

| | | | |
|---|---|---|---|
| 2008/0099699 A1* | 5/2008 | Yabuta | G03F 7/70916 250/504 R |
| 2009/0230326 A1* | 9/2009 | Vaschenko | H05G 2/008 250/492.2 |
| 2009/0272919 A1* | 11/2009 | Abe | G03F 7/70808 250/504 R |
| 2009/0314967 A1* | 12/2009 | Moriya | G21K 5/04 250/504 R |
| 2013/0088699 A1 | 4/2013 | Yakunin et al. | |
| 2016/0282723 A1* | 9/2016 | Derks | G03F 7/70191 |
| 2019/0104604 A1 | 4/2019 | Chien et al. | |
| 2019/0355572 A1* | 11/2019 | Jeon | G03F 7/70916 |

\* cited by examiner

EXTREME ULTRAVIOLET LIGHT SOURCE SYSTEMS

CROSS-REFERENCE TO RELATED APPLICATION(S)

This application claims priority under 35 U.S.C. § 119 to Korean Patent Application No. 10-2020-0126588 filed on Sep. 29, 2020 in the Korean Intellectual Property Office, the disclosure of which is incorporated herein by reference in its entirety.

BACKGROUND

The present disclosure relates to an extreme ultraviolet light source system.

Recently, a lithography method using extreme ultraviolet light for fine machining of a semiconductor device has been proposed. A critical dimension of a circuit formed by the lithography method may depend on a wavelength of a light source. Therefore, it may be beneficial to shorten a wavelength of a light source used for a lithography method to form fine patterns of a semiconductor device. The extreme ultraviolet light has a wavelength of about 1 nm to 100 nm. Since the extreme ultraviolet light is highly absorbable by any material, a reflection type optical system may be used, rather than a transmission type optical system such as a lens. A laser produced plasma (LPP) method using a laser irradiation method has been used for generation of light of an extreme ultraviolet light source.

SUMMARY

Example embodiments of the present invention provide an extreme ultraviolet light source system that may reduce or possibly prevent contamination of a mask of a lithography apparatus by debris from a droplet.

According to some embodiments of the present invention, an extreme ultraviolet light source system may include: a chamber including a condensing mirror and having an intermediate focus, by which extreme ultraviolet light reflected from the condensing mirror may be emitted along a first optical path; a blocking plate on (e.g., in front of) the chamber, which may intersect the first optical path and may include an opening through which the extreme ultraviolet light may be emitted; a transparent cover on the blocking plate so as to cover the opening; a nozzle that may be between the chamber and the blocking plate so that an end portion may face the intermediate focus and may spray a first gas in a direction intersecting the first optical path; and an exhaust pipe between the chamber and the blocking plate so as to face the end portion of the nozzle. In some embodiments, the blocking plate may extend between the transparent cover and the chamber.

According to some embodiments of the present invention, an extreme ultraviolet light source system may include: a chamber including a condensing mirror and having an intermediate focus, by which extreme ultraviolet light reflected from the condensing mirror may be emitted along a first optical path; a blocking plate on (e.g., in front of) the chamber, which may intersect the first optical path and may include an opening through which the extreme ultraviolet light may be emitted; a transparent cover replacement unit including a plurality of transparent covers that may include a first transparent cover on the blocking plate so as to cover the opening and a second transparent cover that is adjacent to the first transparent cover and is moved along one direction by a driving unit, a nozzle that may be between the chamber and the blocking plate so that an end portion may face the intermediate focus and may spray gas in a direction intersecting the first optical path; an exhaust pipe between the chamber and the blocking plate so as to face the end portion of the nozzle; and a control unit that controls the driving unit to replace the first transparent cover with the second transparent cover.

According to some embodiments of the present invention, an extreme ultraviolet light source system may include: a chamber including a condensing mirror and having an intermediate focus, by which extreme ultraviolet light reflected from the condensing mirror may be emitted along a first optical path; a droplet supply unit that may be arranged so as to discharge a droplet along a first path intersecting and above the condensing mirror and may be on one side wall of the chamber; a laser light source irradiating the droplet with laser light at a focal point on the first path; a blocking plate that may be on (e.g., in front of) the chamber so as to intersect the first optical path and may include an opening through which the extreme ultraviolet light may be emitted; a transparent cover on the blocking plate so as to cover the opening; a nozzle that may be between the chamber and the blocking plate so that an end portion may face the intermediate focus and may spray a first gas in a direction intersecting the first optical path; and an exhaust pipe that may be between the chamber and the blocking plate so as to face the end portion of the nozzle and may provide a path through which debris from the droplet passing through the intermediate focus moves. In some embodiments, the blocking plate may extend between the transparent cover and the chamber.

BRIEF DESCRIPTION OF DRAWINGS

The above and other aspects, features, and advantages of the present invention will be more clearly understood from the following detailed description taken in conjunction with the accompanying drawings, in which.

DETAILED DESCRIPTION

Hereinafter, some example embodiments of the present invention will now be described in detail with reference to the accompanying drawings.

Figure 1:
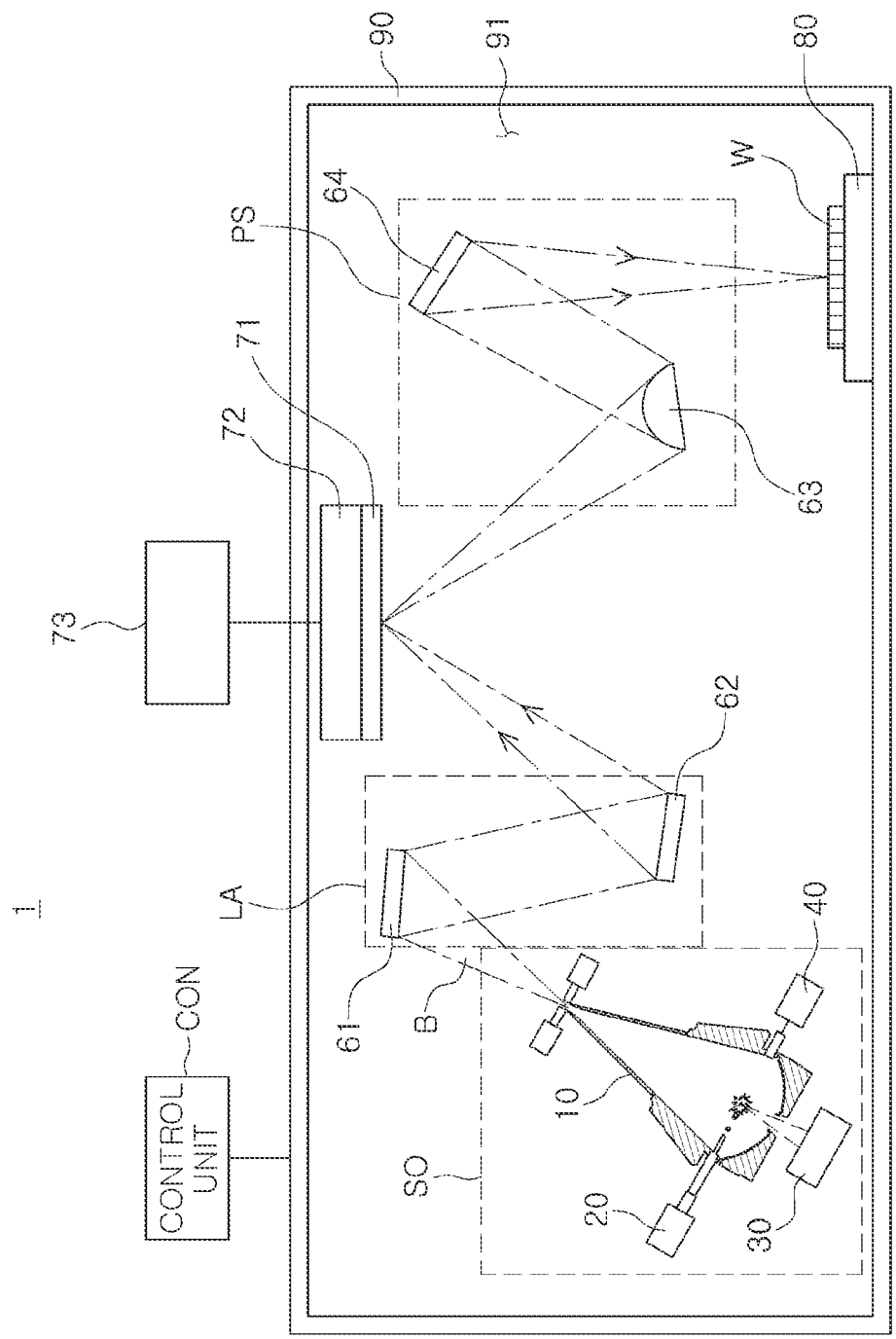
FIG. 1 is a view schematically illustrating an extreme ultraviolet light exposure equipment adopting an extreme ultraviolet light source system according to some embodiments of the present invention.
Figure 2:
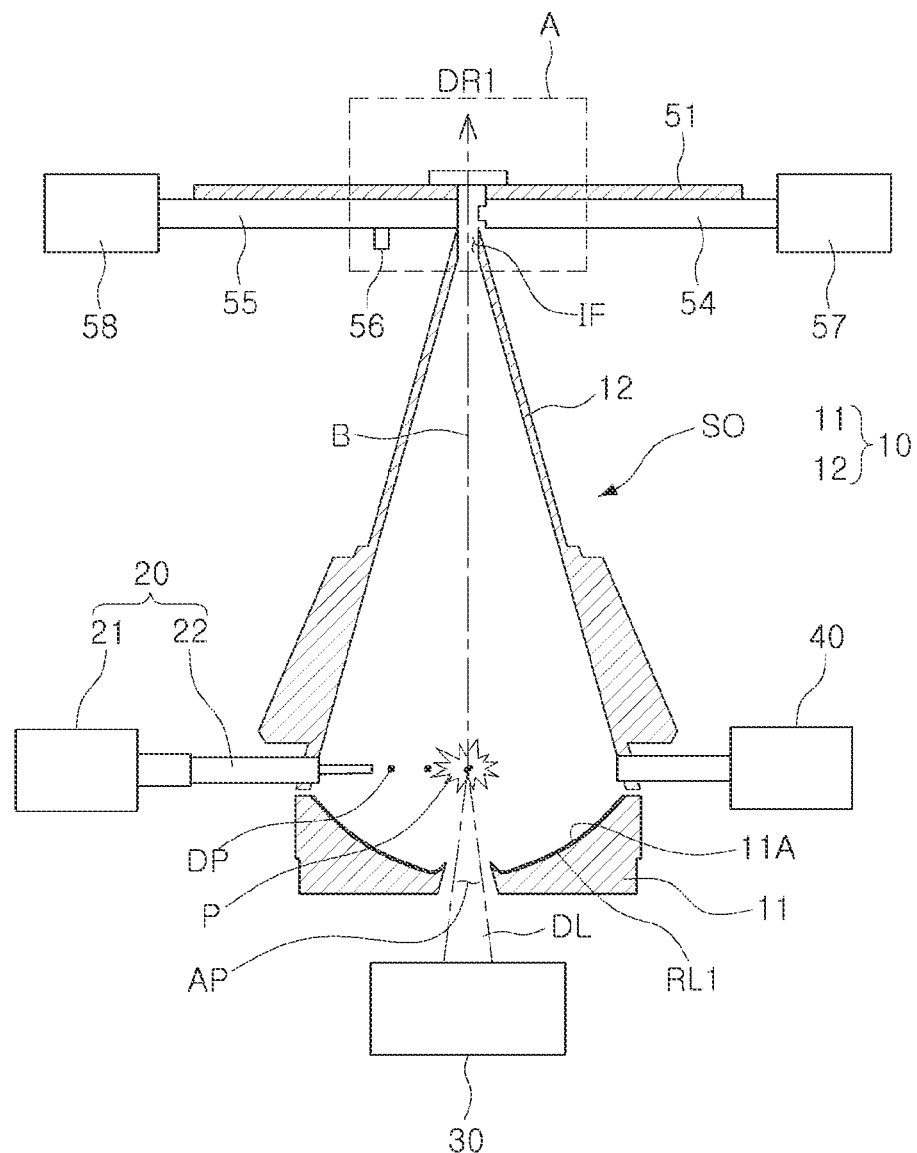
FIG. 2 is a side cross-sectional view schematically illustrating an extreme ultraviolet light source system according to some embodiments of the present invention.
Figure 3:
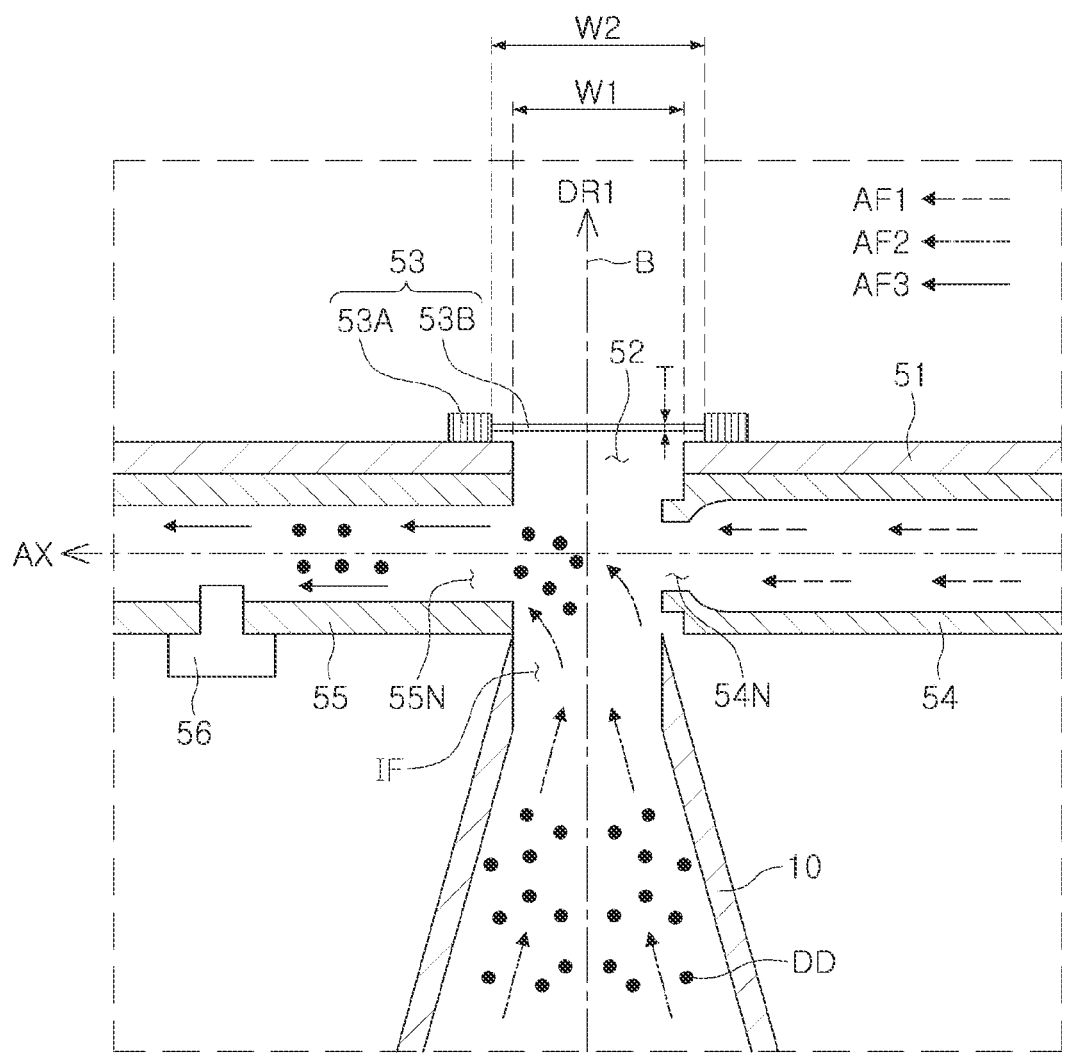
FIG. 3 is an enlarged view of a part A of FIG. 2.

FIG. 1 is a view schematically illustrating an extreme ultraviolet light exposure equipment adopting an extreme ultraviolet light source system according to some embodiments of the present invention, FIG. 2 is a side cross-sectional view schematically illustrating an extreme ultraviolet light source system according to some embodiments of the present invention, and FIG. 3 is an enlarged view of a part A of FIG. 2.

Referring to FIG. 1, an extreme ultraviolet light exposure equipment 1 may include a light exposure chamber 90, an extreme ultraviolet light source system SO, a lithography apparatus LA, a projection system PS, an upper electrostatic chuck (ESC) 72, and a lower electrostatic chuck 80. Each component of the extreme ultraviolet light exposure equipment 1 may be controlled by a control unit CON.

The control unit CON, which may control an overall operation of the light exposure equipment 1, may be implemented by, for example, a central processing unit (CPU), a graphics processing unit (GPU), a microprocessor, an application specific integrated circuit (ASIC), and/or a field programmable gate arrays (FPGA), and may include a memory for storing various data for the operation of the light exposure equipment 1. As used herein the term "and/or" includes any and all combinations of one or more of the associated listed items.

The light exposure chamber 90 may include an internal space 91, and the extreme ultraviolet light source system SO, the lithography apparatus LA, the projection system PS, the upper electrostatic chuck 72, and the lower electrostatic chuck 80 may be disposed in the internal space 91. However, in some embodiments, some components may be disposed outside the exposure chamber 90. For example, a portion of the light source system SO may be disposed outside the exposure chamber 90. A mask 71 may be loaded or unloaded on or from the upper electrostatic chuck 72 by an electrostatic force generated by, for example, power applied from a power supply unit 73, and a substrate W such as a semiconductor wafer may be loaded or unloaded on or from the lower electrostatic chuck 80. The internal space 91 of the light exposure chamber 90 may have a low pressure of, for example, about 5 Pa or lower, or may be in a vacuum state in order to reduce or possibly prevent absorption of extreme ultraviolet light B by gas, the extreme ultraviolet light B being generated in the extreme ultraviolet light source system SO.

Referring to FIG. 2, the extreme ultraviolet light source system SO may generate the extreme ultraviolet light B having a wavelength of less than about 100 nm. The extreme ultraviolet light source system SO may be a laser-produced plasma (LPP) light source that generates plasma P by irradiating a droplet DP formed of at least one of tin (Sn), lithium (Li), or xenon (Xe) with laser light (DL) emitted from a light source unit 30. Further, the extreme ultraviolet light source system SO according to some embodiments may use a so-called master oscillator power amplifier (MOPA) method. That is, the extreme ultraviolet light may be emitted using the plasma P generated by generating a pre-pulse and a main pulse using seed laser emitted from the light source unit 30, irradiating the droplet DP with the pre-pulse to expand the droplet DP, and then irradiating the droplet DP with the main pulse again.

In a light source chamber 10 of the extreme ultraviolet light source system SO, the laser light DL supplied by the light source unit 30 and droplets DP supplied by a droplet supply unit 20 collide with each other 50,000 or more times per second, thereby generating the plasma P. A condensing mirror 11A of the light source chamber 10 may collect the extreme ultraviolet light B omnidirectionally radiated from the plasma P and concentrate the collected extreme ultraviolet light B forward, thereby supplying the extreme ultraviolet light B to the lithography apparatus LA.

The lithography apparatus LA may include a plurality of mirrors and may radiate the extreme ultraviolet light B emitted from the extreme ultraviolet light source system SO toward the upper electrostatic chuck 72. The plurality of mirrors included in the lithography apparatus LA may be conventional ones, which have known configurations and/or structures, and thus, only two mirrors 61 and 62 are illustrated for simplification of the drawing and convenience of explanation.

The projection system PS may include a plurality of mirrors to irradiate the substrate W disposed on the lower electrostatic chuck 80 with a pattern of the extreme ultraviolet light B reflected from the mask 71 attached to the upper electrostatic chuck 72, thereby exposing a surface of the substrate W with the pattern. The plurality of mirrors included in the projection system PS may be conventional ones, which have known configurations and/or structures, and thus, only two mirrors 63 and 64 are illustrated for simplification of the drawing and convenience of explanation.

Hereinafter, the extreme ultraviolet light source system SO will be described in detail with reference to FIGS. 2 through 4.

Referring to FIG. 2, the extreme ultraviolet light source system SO may include the light source chamber 10, the droplet supply unit 20, the light source unit 30, and a catcher 40. Further, the extreme ultraviolet light source system SO may be controlled by the control unit CON controlling the light exposure equipment 1.

The light source unit 30 is a driver light source, and the laser light DL emitted therefrom may be provided in a form of pulse waves and may include a pre-pulse and a main pulse. The pre-pulse may increase a surface area of the droplet DP before the main pulse is absorbed by and interacts with the droplet DP, thereby improving conversion efficiency. The conversion efficiency means a ratio of output power of the emitted extreme ultraviolet light B to input power of the laser light DL emitted from the light source unit 30.

The light source chamber 10 may include a lower body 11 that collects the generated extreme ultraviolet light B, and an upper body 12 that may be coupled to the lower body 11 and may have a conical shape. The inside of the light source chamber 10 may be maintained in an ultra-low pressure state to reduce or possibly prevent absorption of the generated extreme ultraviolet light B by gas in the light source chamber 10. Further, the light source chamber 10 may be filled with, for example, hydrogen ($H_2$) gas and/or oxygen ($O_2$) gas, in an ultra-low pressure state. In some embodiments, the light source chamber 10 may be filled with hydrogen gas and oxygen gas at a volume ratio of about 98.8:0.2.

The condensing mirror 11A that collects the generated extreme ultraviolet light B toward the upper body 12 may be disposed in the lower body 11. The condensing mirror 11A may be a prolate spheroid mirror having a first focal point in a laser light irradiation region of the droplet DP, or a region adjacent to the laser light irradiation region, and a second focal point at an intermediate focus (IF).

A reflection layer RL1 for improving reflectance of the extreme ultraviolet light B may be formed on the condensing mirror 11A. The reflection layer RL1 may be implemented by multilayered thin film in which molybdenum (Mo) and silicon (Si) may be alternately stacked. A light aperture AP may be disposed at the center of the condensing mirror 11A to adjust an irradiation amount of the laser light DL emitted from the light source unit 30.

The upper body 12 may be a cover having a conical shape whose width increases upwardly as illustrated in FIG. 2, and the intermediate focus (IF) that provides a path through which the generated extreme ultraviolet light B is emitted may be positioned at an end portion of the conical shape.

The droplet supply unit 20 for supplying the droplet DP may be disposed on one side of the upper body 12. The catcher 40 in which the droplet DP discharged from the droplet supply unit 20 is accommodated may be disposed on the other side of the upper body 12.

The droplet supply unit 20 may include a droplet supply source 21 and a droplet discharge portion 22. The droplet supply source 21 may supply a target material for forming the droplet DP. The target material may be a material such as tin (Sn), lithium (Li), or xenon (Xe), and the droplet DP may be a liquefied form of the target material or may have a form in which solid particles of the target materials are contained in a liquid material.

The target material stored in the droplet supply source 21 may be pressurized to discharge the droplet DP through the droplet discharge portion 22. The droplet DP may be continuously discharged through the droplet discharge portion 22 at a speed of, for example, about 20 to 70 m/s and a time interval of about 20 μs. The droplet DP may be irradiated with the pre-pulse and the main pulse after being discharged through the droplet discharge portion 22.

Referring to FIGS. 2 and 3, the droplet DP may be expanded in a pancake shape by being irradiated with the pre-pulse, and the plasma P may be radiated after the expanded droplet DP is irradiated with the main pulse. The droplet DP irradiated with the main pulse may explode and may leave debris DD. The debris DD may be a microdroplet, gas, or a mixture thereof. Such debris DD may pass through the intermediate focus IF of the upper body 12 by an ascending air flow AF2 in the light source chamber 10 and may be attached to the mask 71 of the lithography apparatus LA, and thus the lithography apparatus LA may be contaminated (see FIG. 1).

In one example, a transparent cover 53 may be disposed in front of the intermediate focus IF to reduce or possibly prevent contamination in the lithography apparatus LA by the debris DD passing through the intermediate focus IF and scattered. Further, a nozzle 54 that sprays gas AF1 supplied from a gas source 57 may be disposed between the intermediate focus IF and the transparent cover 53 to guide the ascending air flow AF2 of the light source chamber 10 into an exhausted air flow AF3 that is directed toward an exhaust pipe 55. Therefore, a flow of the debris DD contained in the ascending air flow AF2 of the light source chamber 10 may be guided by the gas AF1, such that the debris DD may be discharged through the exhaust pipe 55 along the exhausted air flow AF3. Hereinafter, the transparent cover 53, the nozzle 54, and the exhaust pipe 55 will be described in detail.

Figure 4:
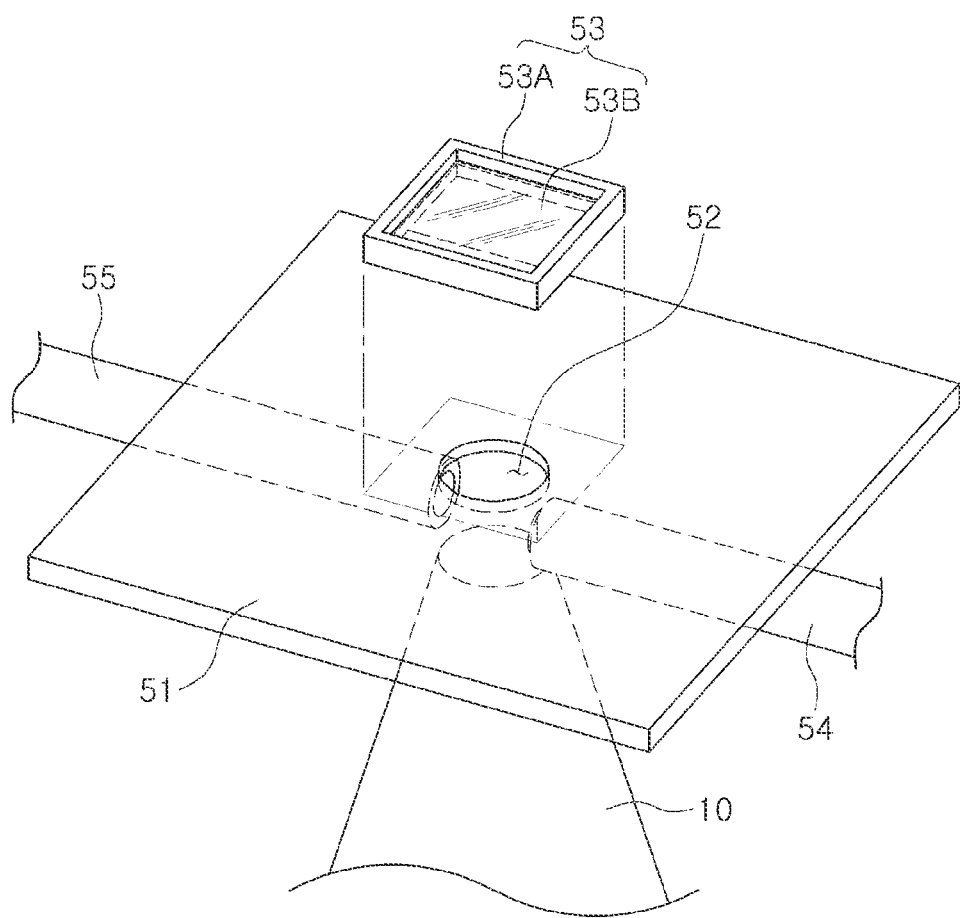
FIG. 4 is an exploded perspective view of an extreme ultraviolet light source system according to some embodiments of the present invention.

Referring to FIGS. 3 and 4, a blocking plate 51 may be disposed in front of the light source chamber 10 so as to intersect a first optical path DR1 of the extreme ultraviolet light B. The blocking plate 51 may block the light source chamber 10 and the lithography apparatus LA from each other and may be provided as a support on which the transparent cover 53 is disposed. An opening 52 through which the extreme ultraviolet light B is transmitted may be formed in a region where the blocking plate 51 and the first optical path DR1 overlap each other. A width W1 of the opening 52 may be sufficient (e.g., wide enough) for the extreme ultraviolet light B to pass through the opening 52, and the extreme ultraviolet light B radiated through the intermediate focus IF may be transmitted through the opening 52 without being blocked by the blocking plate 51.

The transparent cover 53 may be disposed on the blocking plate 51 so as to cover the opening 52. The transparent cover 53 may be disposed on the light source chamber 10, may block the ascending air flow AF2 discharged from the light source chamber 10, and may be used as a guide for changing the ascending air flow AF2 into the exhausted air flow AF3.

The transparent cover 53 may be formed of a transparent material to allow the extreme ultraviolet light B to pass therethrough. A width W2 of the transparent cover 53 may be wider than the width W1 of the opening 52, and thus, the transparent cover 53 may sufficiently cover the opening 52.

The transparent cover 53 may include a cover frame 53A and a transparent thin film layer 53B. The cover frame 53A may fix the transparent thin film layer 53B and may be formed of a material such as a metal or a resin. The transparent thin film layer 53B may be fixed by the cover frame 53A and disposed on the opening 52 of the blocking plate 51. The transparent thin film layer 53B may be formed of a material robust enough to block the ascending air flow AF2 of the light source chamber 10 and through which the extreme ultraviolet light B may be transmitted. The transparent thin film layer 53B may be formed of a transparent material through which 90% or more of extreme ultraviolet light B may be transmitted. For example, the transparent thin film layer 53B may be implemented by a single-layer or multilayer structure of a material such as silicon carbide (SiC) and/or graphene. For example, the transparent thin film layer 53B may have a thickness T of about 10 nm to about 100 nm. In a case in which the thickness T of the transparent thin film layer 53B is less than 10 nm, it may be difficult to sustain a pressure generated by the ascending air flow AF2 of the light source chamber 10 because of the excessively thin thickness T of the transparent thin film layer 53B. Further, in a case in which the thickness T of the transparent thin film layer 53B exceeds 100 nm, the extreme ultraviolet light B transmitted through the transparent thin film layer 3B may be absorbed, and as a result, a light quantity of the extreme ultraviolet light B may be excessively decreased.

The transparent cover 53 may be separably disposed on the blocking plate 51, and thus, may be separated and replaced when damaged or contaminated. In a case in which the transparent thin film layer 53B or the cover frame 53A of the transparent cover 53 is damaged, the ascending air flow AF2 of the light source chamber 10 may be leaked between the transparent cover 53 and the blocking plate 51. At this time, the exhausted air flow AF3 passing through the exhaust pipe 55 is weakened, and thus, an internal pressure of the exhaust pipe 55 is relatively increased. Therefore, whether or not the transparent cover 53 is damaged may be checked by monitoring the internal pressure of the exhaust pipe 55. In some embodiments, a plurality of transparent covers 53 may be disposed on the blocking plate 51. In a case in which the number of transparent covers 53 is plural, when one transparent cover 53 is damaged or contaminated, the control unit CON may detect the damage or contamination and may replace the one transparent cover 53 with another transparent cover 53 that is not damaged or contaminated. Further, in a case in which the number of transparent covers 53 is plural, the control unit CON may replace the transparent cover 53 on a predetermined cycle. Such a cycle is calculated in advance and may be an average period of time within which the transparent cover 53 is contaminated or damaged. In some embodiments, the control unit CON may replace a first transparent cover 53 with a second transparent cover 53 upon a predetermined time elapsing.

The nozzle 54 and the exhaust pipe 55 may be disposed between the light source chamber 10 and the blocking plate 51. The nozzle 54 may be disposed so that an end portion 54N may face the intermediate focus IF and may spray the gas AF1 in a direction intersecting the first optical path DR1 of the extreme ultraviolet light B. The gas AF1 sprayed from the nozzle 54 may move along a first axis (AX) direction intersecting the first optical path DR1 and may guide the ascending air flow AF2 supplied from the light source chamber 10 to the exhausted air flow AF3 directed to the exhaust pipe 55. Further, the debris DD contained in the ascending air flow AF2 may move toward the exhaust pipe 55 along the gas AF1 sprayed from the nozzle 54. The gas AF1 sprayed from the nozzle 54 may have the same composition as that of a major component of the gas in the light source chamber 10. In some embodiments, the gas AF1 sprayed from the nozzle 54 may be hydrogen gas. Further, the gas AF1 sprayed from the nozzle 54 may have a temperature lower than that of the ascending air flow AF2 of the light source chamber 10. The temperature of the gas AF1 sprayed from the nozzle 54 may be equal to or lower than a temperature at which the debris DD contained in the ascending air flow AF2 of the light source chamber 10 is solidified. In some embodiments, in a case in which the droplet DP is tin (Sn), the temperature of the ascending air flow AF2 may be about 400 to about 500° C., the temperature of the gas AF1 sprayed from the nozzle 54 may be about 230° C. or lower at which the debris DD of the droplet DP is solidified, for example, about 25 to about 230° C. Therefore, the debris DD may be solidified by being cooled while passing through the exhaust pipe 55 and may be easily removed through the exhaust air flow AF3.

The exhaust pipe 55 and the nozzle 54 may be disposed to face each other, such that the gas AF1 sprayed from the nozzle 54 and the ascending air flow AF2 of the light source chamber 10 may be exhausted. An end portion 55N of the exhaust pipe 55 may be disposed along the first axis (AX) direction, similarly to the end portion 54N of the nozzle 54. In some embodiments, the exhaust pipe 55 may be connected to a vacuum source 58 so that gas in a region adjacent to the intermediate focus IF may be vacuum-sucked. Therefore, the debris DD contained in the ascending air flow AF2 may be sucked into the exhaust pipe 55 and removed.

A pressure sensor 56 for measuring an internal pressure may be disposed in the exhaust pipe 55. The pressure sensor 56 may measure the internal pressure of the exhaust pipe 55 and transmit a measurement value to the control unit CON. In a case in which a pressure value detected by the pressure sensor 56 is increased to a preset value or more, the control unit CON may determine that the transparent cover 53 is damaged and may display a determination result through, for example, a screen or an alarm lamp. Further, in a case in which the number of transparent covers 53 is plural, the control unit CON may replace the damaged transparent cover 53 with another transparent cover.

The extreme ultraviolet light source system SO having the above-described configuration may block the ascending air flow AF2 of the light source chamber 10 using the transparent cover 53, thereby reducing or possibly preventing contamination in the lithography apparatus LA by the debris DD contained in the ascending air flow AF2. Further, the nozzle 54 and the exhaust pipe 55 may be disposed between the transparent cover 53 and the light source chamber 10 to be adjacent to the intermediate focus IF, and the nozzle 54 may spray the gas AF1 toward the exhaust pipe 55 to direct the ascending air flow AF2 of the light source chamber 10 to the exhaust pipe 55. Therefore, the debris DD contained in the ascending air flow AF2 of the light source chamber 10 may be discharged through the exhaust pipe 55, thereby reducing or possibly preventing contamination in the lithography apparatus LA.

Figure 5:
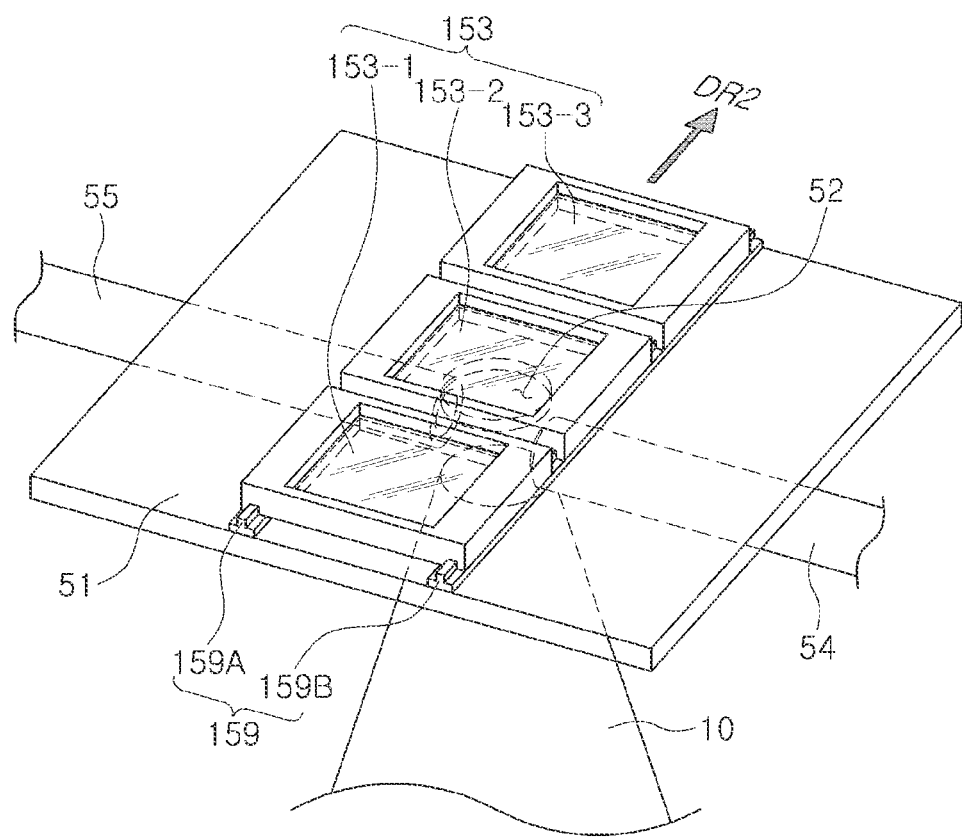
FIGS. 5 and 6 are views illustrating an extreme ultraviolet light source system according to some embodiments of the present invention.
Figure 6:
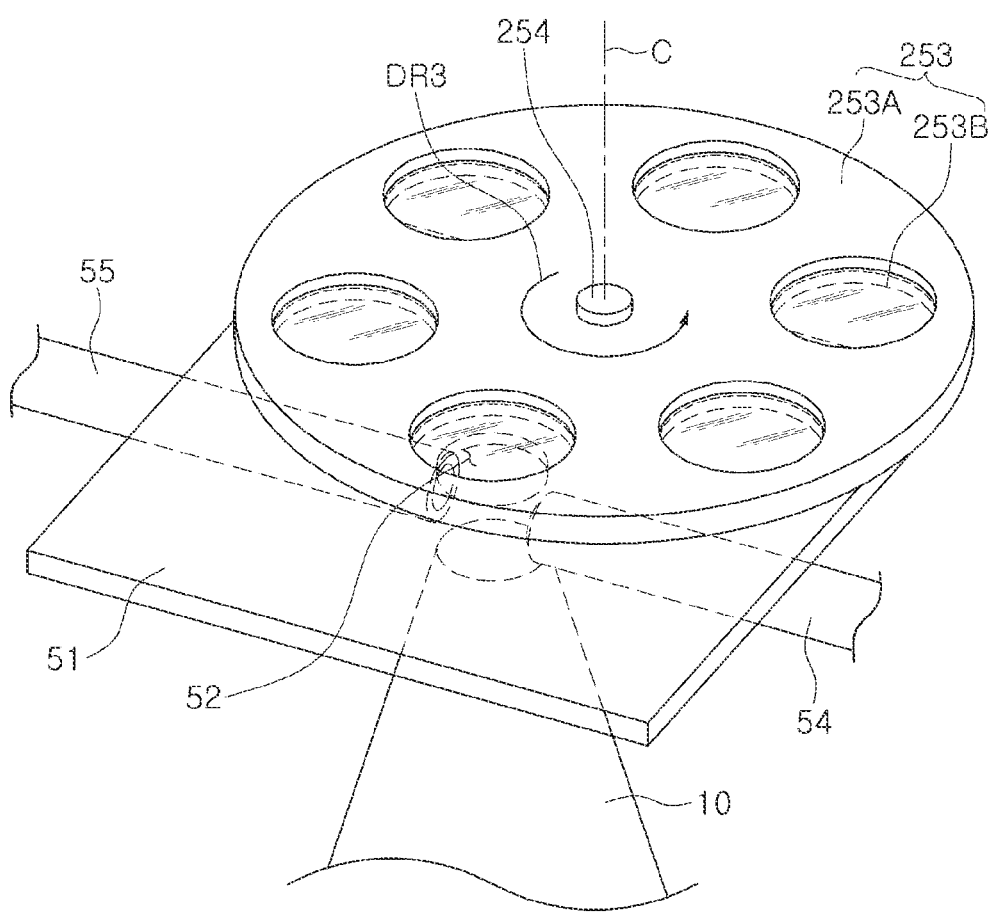

The transparent cover 53 adopted in the extreme ultraviolet light source system according to some embodiments will be described with reference to FIGS. 5 and 6. FIGS. 5 and 6 illustrate a case in which the number of transparent covers adopted in the extreme ultraviolet light source system according to some embodiments of the present invention is plural.

Referring to FIG. 5, the transparent cover 53 adopted in the extreme ultraviolet light source system according to some embodiments may be different in that the transparent cover 53 of the above-described example is substituted with a transparent cover replacement unit 153 including a plurality of transparent covers 153-1 to 153-3. The transparent cover replacement unit 153 may include the plurality of transparent covers 153-1 to 153-3, and the plurality of transparent covers 153-1 to 153-3 may be movably disposed on a transfer member 159. In some embodiments, the transfer member 159 may be a pair of rails 159A and 159B. Although a case in which the transparent cover replacement unit 153 includes three transparent covers 153-1 to 153-3 has been described by way of example, but the number of transparent covers is not limited thereto, and two or more than three transparent covers may be provided.

The control unit CON may control the first to third transparent covers 153-1 to 153-3 disposed on the transfer member 159 to be sequentially positioned on the opening 52 of the blocking plate 51. That is, the transparent cover replacement unit 153 may be moved in a second direction DR2 under the control of the control unit CON, such that the third transparent cover 153-3, the second transparent cover 153-2, and the first transparent cover 153-1 are sequentially positioned on the opening 52. In some embodiments, in a case in which a pressure value detected by the pressure sensor 56 of the exhaust pipe 55 is increased to a reference value or more, the control unit CON may drive a driving unit (not illustrated) to move the first to third transparent covers 153-1 to 153-3 in the second direction DR2. FIG. 5 illustrates a state where the third transparent cover 153-3 is damaged or contaminated and thus is replaced with the second transparent cover 153-2.

Referring to FIG. 6, a transparent cover replacement unit 253 adopted in the extreme ultraviolet light source system according to some embodiments may be similar to the above-described example in that a plurality of transparent covers are included. However, the plurality of transparent covers are not individually separate, and a plurality of transparent thin film layers 253B are disposed in one cover frame 253A. In some embodiments, the transparent thin film layer 253B may be disposed in each opening of the circular cover frame 253A having a plurality of openings. In the above-described example, a plurality of transparent covers are disposed on a pair of rails and move in one direction. On the other hand, in this example, a driving unit 254 may be disposed on a rotation axis C of the circular cover frame 253A to rotate the circular cover frame 253A in a third direction DR3, such that each of the plurality of transparent thin film layer 253B is positioned on the opening 52 of the light source chamber 10. In this case, when the circular cover frame 253A rotates once, the control unit CON may display that the circular cover frame 253A needs to be replaced through, for example, a screen or an alarm lamp.

As set forth above, according to some embodiments of the present invention, the extreme ultraviolet light source system, in which contamination of the mask of the lithography apparatus by debris from a droplet may be reduced or possibly prevented, may be provided.

While some example embodiments have been shown and described above, it will be apparent to those skilled in the art that modifications and variations could be made without departing from the scope of the present invention as defined by the appended claims.

What is claimed is:

1. An extreme ultraviolet light source system comprising:
a chamber including a condensing mirror that is configured to reflect extreme ultraviolet light along an optical path;
a blocking plate on the chamber and comprising an opening that is configured to pass the extreme ultraviolet light therethrough;
a transparent cover on the blocking plate and covering the opening, the blocking plate extending between the transparent cover and the chamber;
a nozzle between the chamber and the blocking plate and comprising an end portion adjacent the opening, the end portion of the nozzle being configured to spray a first gas in a direction intersecting the optical path; and
an exhaust pipe between the chamber and the blocking plate and facing the end portion of the nozzle,
wherein a width of the transparent cover is larger than a width of the opening.

2. The extreme ultraviolet light source system of claim 1, wherein an internal space of the chamber is configured to include a second gas that comprises a material the same as that of the first gas.

3. The extreme ultraviolet light source system of claim 2, wherein the first gas and the second gas are each hydrogen ($H_2$) gas.

4. The extreme ultraviolet light source system of claim 3, wherein a temperature of the first gas is lower than a temperature of the second gas.

5. The extreme ultraviolet light source system of claim 4, wherein the temperature of the first gas is in a range of about 25° C. to about 230° C., and the temperature of the second gas is in a range of about 400° C. to about 500° C.

6. The extreme ultraviolet light source system of claim 1, wherein the exhaust pipe comprises a pressure sensor that is configured to measure an internal pressure of the exhaust pipe.

7. The extreme ultraviolet light source system of claim 1, wherein the transparent cover includes:
a transparent thin film layer that is configured to pass the extreme ultraviolet light therethrough; and
a cover frame contacting an edge of the transparent thin film layer.

8. The extreme ultraviolet light source system of claim 7, wherein the transparent thin film layer has a thickness of in a range of 10 nm to 100 nm.

9. The extreme ultraviolet light source system of claim 1, wherein the exhaust pipe is configured to receive the first gas from the end portion of the nozzle.

10. The extreme ultraviolet light source system of claim 1, wherein the end portion of the nozzle is adjacent to an intermediate focus, and the condensing mirror is configured to reflect the extreme ultraviolet light along the optical path by the intermediate focus.

11. An extreme ultraviolet light source system comprising:
a chamber including a condensing mirror that is configured to reflect extreme ultraviolet light along an optical path;
a blocking plate on the chamber and comprising an opening that is configured to pass the extreme ultraviolet light therethrough;
a transparent cover replacement unit including a plurality of transparent covers on the blocking plate, the plurality of transparent covers including a first transparent cover covering the opening and a second transparent cover adjacent to the first transparent cover;
a nozzle between the chamber and the blocking plate and comprising an end portion adjacent the opening, the nozzle being configured to spray a gas in a direction intersecting the optical path;
an exhaust pipe between the chamber and the blocking plate and facing the end portion of the nozzle;
a driving unit configured to move the plurality of transparent covers; and
a control unit configured to control the driving unit to replace the first transparent cover with the second transparent cover,
wherein the exhaust pipe includes a pressure sensor that is configured to measure an internal pressure of the exhaust pipe and configured to transmit the measured internal pressure to the control unit, and
the control unit is configured to control the driving unit to replace the first transparent cover with the second transparent cover when the measured internal pressure is higher than a predetermined value.

12. The extreme ultraviolet light source system of claim 11, wherein the plurality of transparent covers each include:
a transparent thin film layer that is configured to pass the extreme ultraviolet light therethrough; and
a cover frame contacting an edge of the transparent thin film layer.

13. An extreme ultraviolet light source system comprising:
a chamber including a condensing mirror, that is configured to reflect extreme ultraviolet light along an optical path;
a blocking plate on the chamber and comprising an opening that is configured to pass the extreme ultraviolet light therethrough;
a transparent cover on the blocking plate and covering the opening, the blocking plate extending between the transparent cover and the chamber;
a nozzle between the chamber and the blocking plate and comprising an end portion adjacent the opening, the end portion of the nozzle being configured to spray a first gas in a direction intersecting the optical path; and
an exhaust pipe between the chamber and the blocking plate and facing the end portion of the nozzle,
wherein an internal space of the chamber is configured to include a second gas, and
a temperature of the first gas is lower than a temperature of the second gas.

14. The extreme ultraviolet light source system of claim 13, wherein the first gas and the second gas comprise the same material.

15. The extreme ultraviolet light source system of claim 13, wherein the temperature of the first gas is in a range of about 25° C. to about 230° C., and the temperature of the second gas is in a range of about 400° C. to about 500° C.

16. The extreme ultraviolet light source system of claim 13, wherein the exhaust pipe comprises a pressure sensor that is configured to measure an internal pressure of the exhaust pipe.

17. The extreme ultraviolet light source system of claim 13, wherein the transparent cover includes:

a transparent thin film layer that is configured to pass the extreme ultraviolet light therethrough; and a cover frame contacting an edge of the transparent thin film layer.

18. The extreme ultraviolet light source system of claim 13, further comprising:

a droplet supply unit that is configured to discharge a droplet along a first path and above the condensing mirror and is on a side wall of the chamber; and a laser light source configured to irradiate the droplet with laser light at a focal point on the first path, wherein the exhaust pipe is configured to receive debris from the droplet.

19. The extreme ultraviolet light source system of claim 18, wherein the droplet comprises tin (Sn).

20. The extreme ultraviolet light source system of claim 13, wherein the transparent cover is a first transparent cover of a transparent cover replacement unit that further comprises a second transparent cover adjacent to the first transparent cover, wherein the extreme ultraviolet light source system further comprises:

a driving unit configured to move the first and second transparent covers; and a control unit configured to control the driving unit to replace the first transparent cover with the second transparent cover, wherein the control unit is configured to control the driving unit to replace the first transparent cover with the second transparent cover upon a predetermined time elapsing.

* * * * *